US009685916B2

(12) United States Patent
Keskin et al.

(10) Patent No.: US 9,685,916 B2
(45) Date of Patent: Jun. 20, 2017

(54) AUDIO INTERFACE CIRCUITS AND METHODS

(71) Applicant: QUALCOMM Incorporated, San Diego, CA (US)

(72) Inventors: Mustafa Keskin, San Diego, CA (US); Khalid Junaid Sidiqi, San Diego, CA (US); Louis Dominic Oliveira, San Diego, CA (US); Robert Philip Gilmore, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 51 days.

(21) Appl. No.: 14/880,939

(22) Filed: Oct. 12, 2015

(65) Prior Publication Data

US 2017/0104460 A1    Apr. 13, 2017

(51) Int. Cl.
*H04R 29/00* (2006.01)
*H03F 3/181* (2006.01)

(52) U.S. Cl.
CPC .............. *H03F 3/181* (2013.01); *H04R 29/00* (2013.01); *H03F 2200/03* (2013.01)

(58) Field of Classification Search
CPC .............. H04M 1/271; H04M 1/6091; H04M 1/72525; H04M 1/7253; H04M 1/7255; H04M 1/72561; H04M 2250/02; H04M 11/04; H04M 2250/74; H04R 2499/11; H04R 1/1041; H04R 1/1083;
(Continued)

(56) References Cited

U.S. PATENT DOCUMENTS

| 8,299,361 B2 | 10/2012 | Ye et al. |
| 8,459,559 B2 | 6/2013 | Shadwell, Jr. et al. |
| 8,660,812 B2 | 2/2014 | Gregg et al. |

(Continued)

FOREIGN PATENT DOCUMENTS

| CN | 101184310 A | 5/2008 |
| CN | 202424822 U | 9/2012 |

(Continued)

OTHER PUBLICATIONS

Kuo Y-S., et al., "Hijacking Power and Bandwidth from the Mobile Phone's Audio Interface," ACM DEV'10, Dec. 17-18, 2010, London, UK, 10 pp.

(Continued)

*Primary Examiner* — Akelaw Teshale
(74) *Attorney, Agent, or Firm* — Haynes and Boone, LLP (57) ABSTRACT

In one embodiment, an electronic device includes an audio connector port comprising a ground terminal and one or more audio output terminals, a first audio amplifier coupled to one of the audio output terminals, and a multiplexer having an output terminal coupled to the input terminal of the first audio amplifier. Sense circuits inside the electronic device may be alternately coupled through the multiplexer and first audio amplifier so that, in a first mode of operation, the multiplexer couples the audio signal to the first audio output terminal, and in a second mode of operation, the multiplexer couples an analog voltage corresponding to an internally sensed value to the first audio output terminal. Use of the audio connector and audio circuitry to access internal electrical parameters may facilitate testing and analysis of internal systems.

22 Claims, 10 Drawing Sheets

(58) Field of Classification Search
CPC .......... H04R 2201/107; H04R 2420/01; H04R 2420/05; H04R 2420/09
USPC ......... 381/120, 123, 82, 1, 10, 107, 122, 13, 381/172, 384, 55, 61, 63, 71.1, 74, 77, 381/79, 91, 92, 58
See application file for complete search history.

(56) References Cited

U.S. PATENT DOCUMENTS

| | | | |
|---|---|---|---|
| 8,683,087 | B2 | 3/2014 | Connolly et al. |
| 8,750,535 | B2* | 6/2014 | Yamkovoy ............... H04R 1/10 381/111 |
| 9,016,572 | B2 | 4/2015 | Babu et al. |
| 9,118,406 | B2 | 8/2015 | Misaki |
| 2002/0137505 | A1* | 9/2002 | Eiche ................. B60R 11/0241 455/425 |
| 2003/0104845 | A1* | 6/2003 | Chen .................. H04M 1/6083 455/569.1 |
| 2005/0147229 | A1* | 7/2005 | King .................. H04M 1/6058 379/388.01 |
| 2006/0052072 | A1* | 3/2006 | Hess ................... H04B 1/3877 455/127.4 |
| 2007/0186656 | A1 | 8/2007 | Goldberg et al. |
| 2011/0019843 | A1* | 1/2011 | Chen .................... H03F 1/0205 381/120 |
| 2011/0105938 | A1* | 5/2011 | Hardt .................. A61B 5/0482 600/544 |
| 2011/0183637 | A1 | 7/2011 | Flickinger et al. |
| 2012/0011071 | A1 | 1/2012 | Pennock et al. |
| 2012/0212233 | A1 | 8/2012 | Coccio |
| 2013/0087614 | A1 | 4/2013 | Limtao et al. |
| 2013/0108063 | A1 | 5/2013 | Verhoeve et al. |
| 2013/0108064 | A1 | 5/2013 | Kocalar et al. |
| 2013/0148818 | A1* | 6/2013 | Yamkovoy ........... H04R 1/1041 381/74 |
| 2013/0226499 | A1 | 8/2013 | Platt et al. |
| 2013/0288598 | A1 | 10/2013 | Parkin |
| 2014/0003616 | A1 | 1/2014 | Johnson et al. |
| 2014/0072144 | A1* | 3/2014 | Wu ....................... H03F 1/0244 381/107 |
| 2014/0160955 | A1 | 6/2014 | Lum et al. |
| 2014/0162628 | A1 | 6/2014 | Bevelacqua et al. |
| 2014/0194069 | A1 | 7/2014 | Liu et al. |
| 2014/0216136 | A1 | 8/2014 | Yim |
| 2014/0242919 | A1 | 8/2014 | Matsumoto et al. |

FOREIGN PATENT DOCUMENTS

| | | |
|---|---|---|
| KR | 101423042 B1 | 7/2014 |
| WO | 0184809 A2 | 11/2001 |

OTHER PUBLICATIONS

Verma, S., et al., "AudioDAQ: Turning the Mobile Phone's Ubiquitous Headset Port into a Universal Data Acquisition Interface," SenSys'12, Nov. 6-9, 2012, 14 pages.

Aroca R.V., et al., "Method for Reading Sensors and Controlling Actuators Using Audio Interfaces of Mobile Devices", US National Library of Medecine, Feb. 6, 2012 (Feb. 6, 2012), XP055322584, vol. 12, pp. 1572-1593. Retrieved from the Internet: URL: https://www.ncbi.nlm.nih.gov/pmc/articles/PMC3304128/ (Retrieved on Nov. 24, 2016).

Szczys M., "Android Audio-serial Connection | Hackaday", Hackaday.com, Feb. 1, 2010 (Feb. 1, 2010), XP055322430, 6 pages. Retrieved from the Internet: URL: http://hackaday.com/2010/02/01/android-audio-serial-connection/ [retrieved on Nov. 23, 2016].

International Search Report—PCT/US2016/053140—ISA/EPO—Dec. 2, 2016, pp. 1-5.

Written Opinion—PCT/US2016/053140—ISA/EPO—Dec. 2, 2016, pp. 1-7.

Robinson, et al., "Demo abstract: AudioDAQ: Turning the mobile phone's headset port into a universal data acquisition interface", Information Processing in Sensor Networks (IPSN), 2012 ACM/IEEE 11th International Conference on DOI: 10.1109/IPSN.2012.6920925, Publication Year: 2012, pp. 151-152.

\* cited by examiner

AUDIO INTERFACE CIRCUITS AND METHODS

BACKGROUND

The present disclosure relates to electronic circuits, systems and apparatuses, and in particular, to audio interface circuits and methods.

Recently, the complexity and functionality of handheld electronic devices has accelerated at an ever increasing pace. More and more features and functions are being added to electronic devices such as cellular phones, tablet computers, portable music players, cameras, fitness devices, and even wrist watches. As the functionality of such devices increases, so too does the complexity of the electronic circuits in such devices.

However, these devices often share one common constraint—small size and limited surface area. As the complexity and functionality of the devices increases, it becomes increasingly important to access internal circuits and functionality to both relay information to an end user and determine the operating conditions of various system components during the manufacturing of the device or to evaluate failures of devices in the field.

Figure 1:
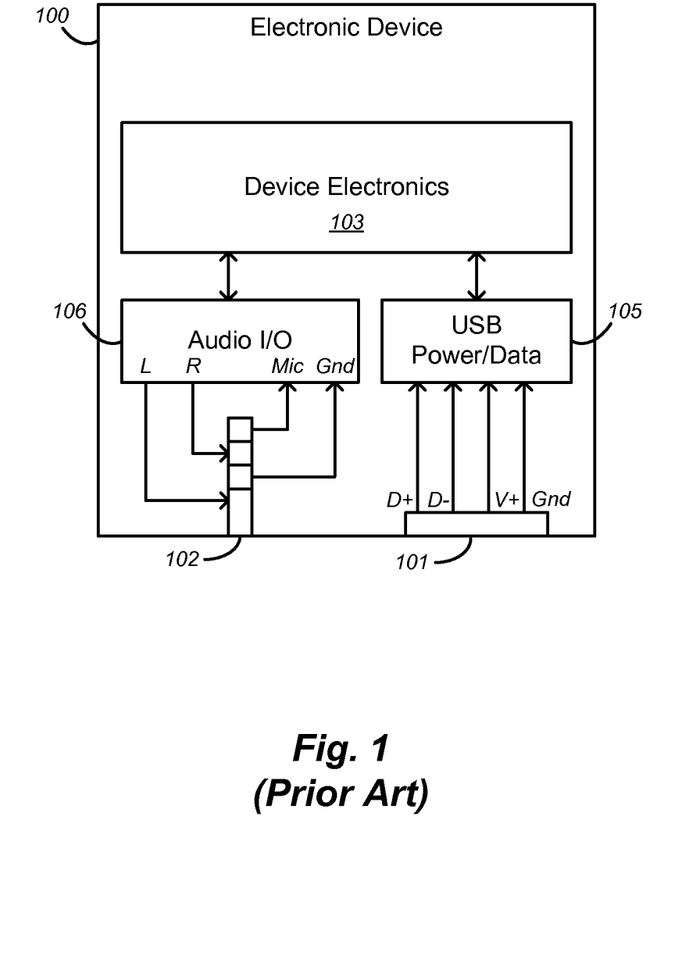
FIG. 1 illustrates a typical handheld electronic device.

For example, as illustrated in electronic device 100 of FIG. 1, many contemporary electronic devices are limited to two electrically wired input/output (I/O) ports—i.e., a Universal Serial Bus (USB) port 101 and an audio port 102. USB ports are typically used to communicate data (e.g., D+/D−) between the device electronics 103 and USB circuitry 105 and another external computer system (not shown), for example, and are often used to receive power (e.g., V+ and ground) to power the electronic device and/or charge a battery in the electronic device (not shown). Audio ports typically receive an audio jack which may include a microphone input (Mic) and left and right stereo outputs. Accordingly, an audio signal may be received on the Mic input and coupled to audio circuits 106. The audio circuits may also generate a stereo output, for example.

Therefore, the reduction in size and increase in complexity of modern electronic devices exacerbates the problem faced by system manufacturers and end users to access the growing amount of information inside such devices.

SUMMARY

The present disclosure pertains to audio interface circuits and methods. In one embodiment, an electronic device includes an audio connector port comprising a ground terminal and one or more audio output terminals, a first audio amplifier coupled to one of the audio output terminals, and a multiplexer having an output terminal coupled to the input terminal of the first audio amplifier. Sense circuits inside the electronic device may be alternately coupled through the multiplexer and first audio amplifier so that, in a first mode of operation, the multiplexer couples the audio signal to the first audio output terminal, and in a second mode of operation, the multiplexer couples an analog voltage corresponding to an internally sensed value to the first audio output terminal. Used of the audio connector and audio circuitry to access internal electrical parameters may facilitate testing and analysis of internal systems.

The following detailed description and accompanying drawings provide a better understanding of the nature and advantages of the present disclosure.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 2:
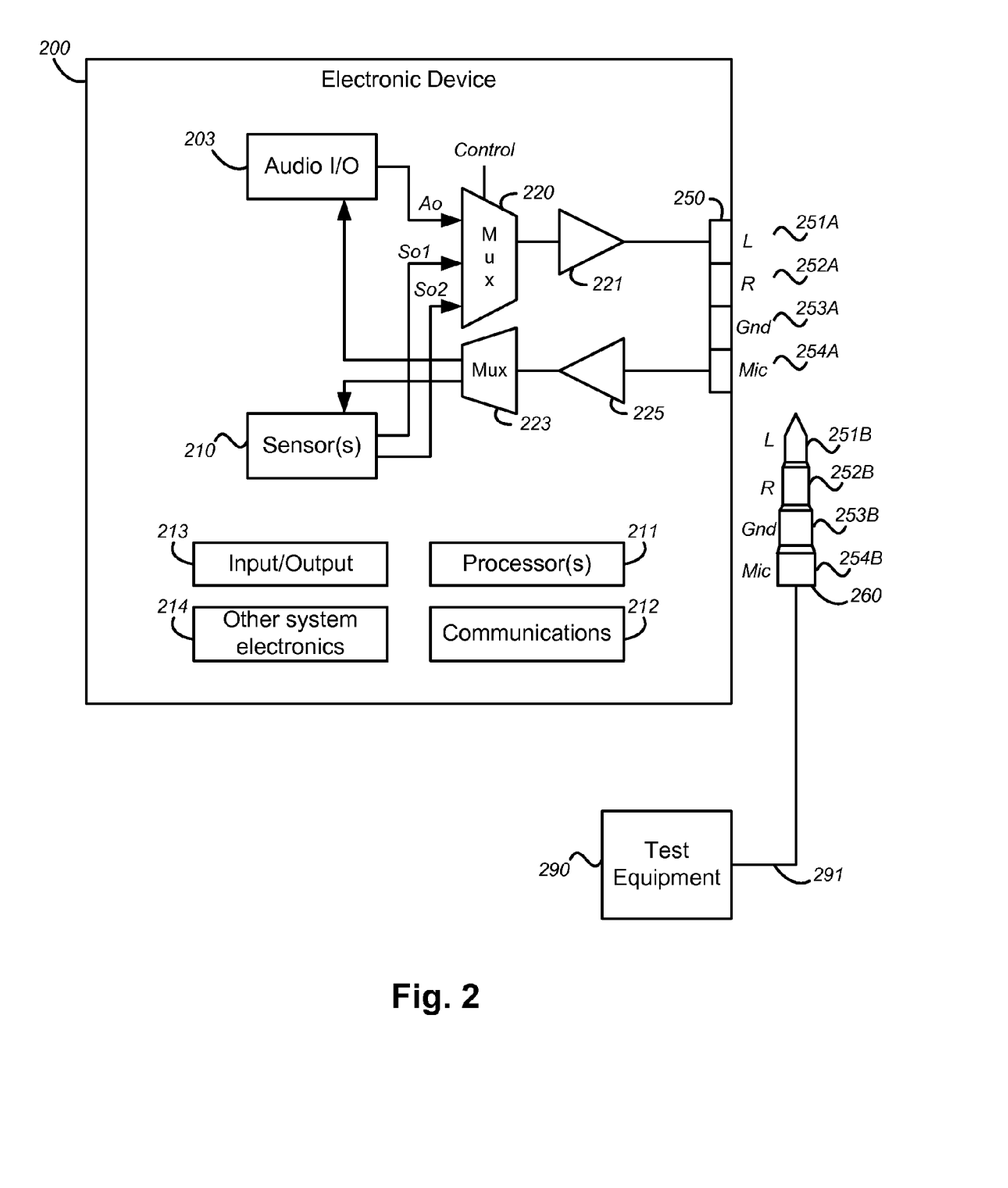
FIG. 2 illustrates an audio interface according to an embodiment.

FIG. 2 illustrates an example electronic device 200 according to an embodiment. Embodiments of the present disclosure include one or more multiplexer circuits 220 coupled to the input of an audio amplifier 221 to allow internal analog signals to be sensed externally through an audio output terminal of an audio connector port. For example, electronic device 200 includes an audio connector port 250 comprising a left stereo output terminal 251A (e.g., a headphone left output), a right stereo output terminal 252A (e.g., a headphone right output), a ground terminal 253A, and a Mic input terminal 254A. Audio connector port 250 may comprise a female adapter configured to receive male connector plug 260 comprising a left stereo connector tip 251B, a right stereo connector sleeve 252B, a ground sleeve 253B, and a Mic outer ring 254B, for example.

Typically, audio male connector plug 260 may be coupled to a stereo headset and microphone. However, embodiments of the present disclosure may use one or more audio connection terminals to sense internal functionality of the electronic device for testing or other purposes, for example. Audio channels may be designed to have high fidelity characteristics, which may include low noise specifications and low harmonic distortion specifications (e.g. total harmonic distortion, "THD"). Accordingly, features and advantages of the present disclosure include using audio channels in a dual purpose role of sending and receiving audio signals and sending and receiving potentially sensitive analog voltages for testing or otherwise sensing internal nodes of various integrated circuits used inside the electronic device, for example.

Examples of electronic devices that may use the present techniques include, but are not limited to, cellular phones (e.g., smart phones), tablet computers, portable music players, digital cameras, biometric sensors (e.g., electronic fitness devices), smart watches, and other electronic devices with extensive integrated functionality and/or limited surface area, for example. Electronic device 200 may include various internal circuits such as one or more processors 211, communications circuits 212 (e.g., radio frequency (RF) communications such as Wifi, cellular, Bluetooth, and global positioning systems (GPS)), input/output circuits 213 such as displays (e.g., touch screens), audio inputs and outputs and haptics, and various other system electronics 214, for example.

As mentioned above, in this example, electronic device 200 comprises an audio connector port 250 including a first audio output terminal 251A (e.g., left headphone out, "L"), a second audio output terminal 252A (e.g., right headphone out, "R"), a ground terminal 253A ("Gnd"), and a microphone audio input terminal 254A ("Mic"). While the present example is illustrated using a four (4) terminal audio connector port 250, it is to be understood that other embodiments may use connectors with a different number of terminals. An audio amplifier 221 comprises an input terminal and an output terminal. Analog signals on the input terminal are amplified at the output terminal (e.g., by some gain defined by the ratio of input voltage to output voltage, Vin/Vout). The output terminal of audio amplifier 221 carrying the amplified analog signal is coupled to audio output terminal 251A. A multiplexer ("MUX") 220 has multiple input terminals and an output terminal coupled to the input terminal of audio amplifier 221. An audio circuit 203 generates an audio signal, Ao, to a first input terminal multiplexer 203. Audio circuit 203 may be an audio coder-decoder (CODEC), for example, that receives a digital audio signal and generates an analog audio signal, Ao.

Features and advantages of the present disclosure include one or more sense circuits 210 that generate analog voltage outputs that may be coupled to an audio output terminal through MUX 220 and audio amplifier 221. Sense circuits 210 may be located anywhere inside the electronic device and may be integrated on integrated circuits in the electronic device, including processors, power management circuits, radio frequency integrated circuits, and other integrated circuits or systems as illustrated further below. In this example, sense circuits 210 generate an analog voltage to a second input terminal of MUX 220. MUX 220 may be configured by control signals (CONTROL) to selectively and alternatively couple the audio signal, Ao, or an analog voltage (e.g., So1 or So2) from a sensor to the output terminal of the MUX. For instance, in response to a first control signal, the system may be configured in a first mode of operation where MUX 220 couples the audio signal on the first input terminal of MUX 220 through audio amplifier 221 to audio output terminal 251A. In response to a second control signal, the system may be configured in a second mode of operation where MUX 220 couples the analog voltage on one of the other input terminals of MUX 220 through audio amplifier 221 to audio output terminal 251A.

As mentioned above, audio channels may be designed to have high fidelity characteristics, which may include low noise specifications and low harmonic distortion specifications (e.g. total harmonic distortion or THD). For example, audio amplifier 221 may be an audio power amplifier for driving current into headphone speakers. However, such an amplifier may be optimized to receive an audio signal having a maximum voltage value (e.g., the maximum voltage amplitude produced by audio I/O circuit 203). Therefore, sensors 210 may be configured to generate the analog voltage so that the analog voltage has a value less than a maximum value of the audio signal for optimum processing in audio amplifier 221, for example. Additionally, audio amplifier 221 may be optimized to amplify signals having frequencies of less than 20 kHz. Accordingly, sensors 210 may be configured to generate the analog voltage so that the frequency of the analog voltage is less than 20 kHz (e.g., including audible frequencies from 20 Hz to 20,000 Hz). Further, audio amplifier 221 may be an audio power amplifier having a noise characteristic below a particular audio noise threshold and a harmonic distortion characteristic below a particular audio harmonic distortion threshold. Thus, analog voltages from one or more sensors 210 may be amplified with low noise and distortion, which may be advantageous for accurately reproducing signals external to the electronic device 200.

As illustrated in FIG. 2, embodiments may couple analog voltages from multiple sensors 210 to an audio output terminal through MUX 220 and audio amplifier 221. For example, a second sense circuit may generate a second analog voltage So2 to a third input terminal of MUX 220. In the second mode of operation, MUX 220 couples the second analog voltage So2 on the third input terminal of the MUX through the audio amplifier 221 to audio output terminal 251A. Accordingly, embodiments may couple one analog voltage from one sensor to the audio output terminal for a first time period and then, in response to control signals, couple one or more other analog voltages from one or more other sensors to the audio output terminal for different time periods.

As further illustrated in FIG. 2, internal sensor outputs may advantageously be coupled through one or more audio output terminals to test equipment 290 using an audio plug 260 and audio cable 291. Test equipment 290 may include an oscilloscope, a data acquisition system, or another computer including one or more processors and memory storing executable code, which when executed by a processor causes the processor to acquire and present data corresponding to analog voltages received from the electronic device through the audio output terminal, for example. Test equipment 290 may be a tablet computer or a smart phone with a mobile testing application installed thereon, for example. In yet other examples, equipment 290 may be a storage device, tablet smartphone, or laptop, which are used to store or monitor data coming from sensors.

In some embodiments, the Mic input 254 may include feedback circuitry 225 that may be used to interface with internal functionality of the electronic device 200. For example, circuitry 225 may perform filtering if needed, or act as a unity gain buffer, or provide digital latches if a digital interface is present. Circuitry 225 may provide isolation circuits or buffering to match the impedances, for example. In one particular embodiment, circuitry 225 may comprise an audio input amplifier to receive a microphone line input signal during a normal mode of operation. An output of the audio input amplifier may be coupled through a second MUX 223 to selectively coupled signals received on the Mic input 254A to either the Audio I/O circuit 203 or sensors 210. For example, in some applications it may be desirable to have a feedback path to a sensor. In a test mode, a sensor 210 may output a signal through MUX 220 and audio amplifier 221 to a left or right output terminal. External circuitry may receive the signal and generate a feedback signal (e.g., a calibration signal) to sensor 210 through an audio input amplifier and MUX 223, for example. As but one example, a bandgap voltage may be output through MUX 220 and audio amplifier 221 and calibrated using an input received on Mic terminal 254A and coupled through an audio input amplifier and MUX 223, for example.

Figure 3:
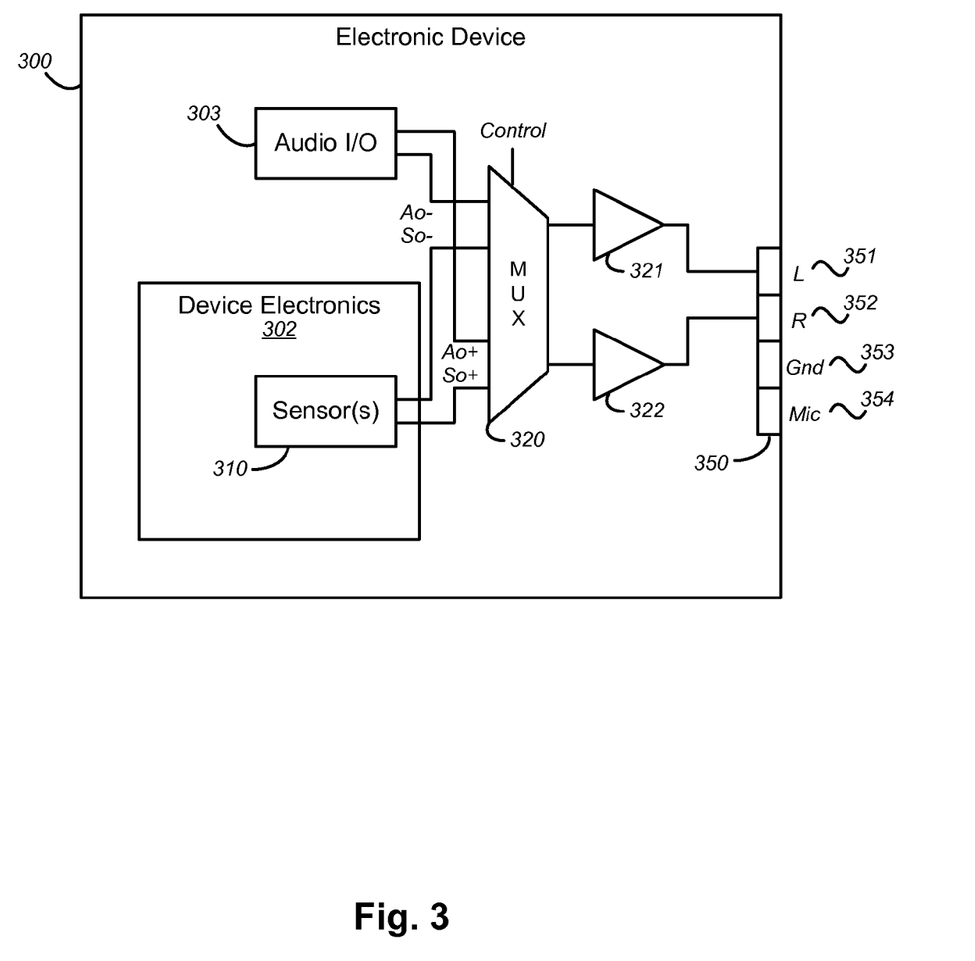
FIG. 3 illustrates an audio interface according to another embodiment.

FIG. 3 illustrates an audio interface according to another embodiment. In this example, audio connector port 350 has two audio output terminals 351 and 352 (e.g., headphone left and headphone right). Here, electronic device 300 includes audio amplifier 321 and audio amplifier 322. An output terminal of audio amplifier 321 is coupled to audio output terminal 351 and an output terminal of audio amplifier 322 is coupled to audio output terminal 352. MUX 320 includes a first input coupled to an output of audio circuit 303 and two input terminals coupled to output terminals of one or more sensors 310. MUX 320 selectively couples analog signals on the input terminals to two output terminals, which are coupled to input terminals of audio amplifiers 321 and 322. Audio circuit 303 may generate a differential audio signal (Ao+/Ao−), for example, and during a first mode of operation the differential audio signal is coupled through MUX 320 and audio amplifiers 321 and 322 to the L and R output terminals 351 and 352. During a second mode of operation (e.g., a test or data acquisition mode), multiple scenarios are possible. For example, in one embodiment a first analog voltage from a first sense circuit may be coupled to a first output of MUX 320 and to the L output terminal 351 through amplifier 321, and a second analog voltage from a second sense circuit is coupled to the second output of MUX 320 and to the R output terminal through amplifier 322. Accordingly, multiple sensors may be monitored independently and simultaneously using multiple output terminals of an audio connector.

In another embodiment, a sense circuit may generate a differential analog voltage (So+/So−) to a second input terminal of MUX 320 and a third input terminal of MUX 320. Accordingly, in the second (or test) mode of operation, MUX 320 couples a first analog voltage on the second input terminal of MUX 320 through audio amplifier 321 to audio output terminal 351 and MUX 320 couples a second analog voltage on the third input terminal of MUX 320 through audio amplifier 322 to audio output terminal 352. Differential signals may provide improved measurement accuracy of internal circuit parameters and are useful for transferring such information across cables, for example.

Figure 4:
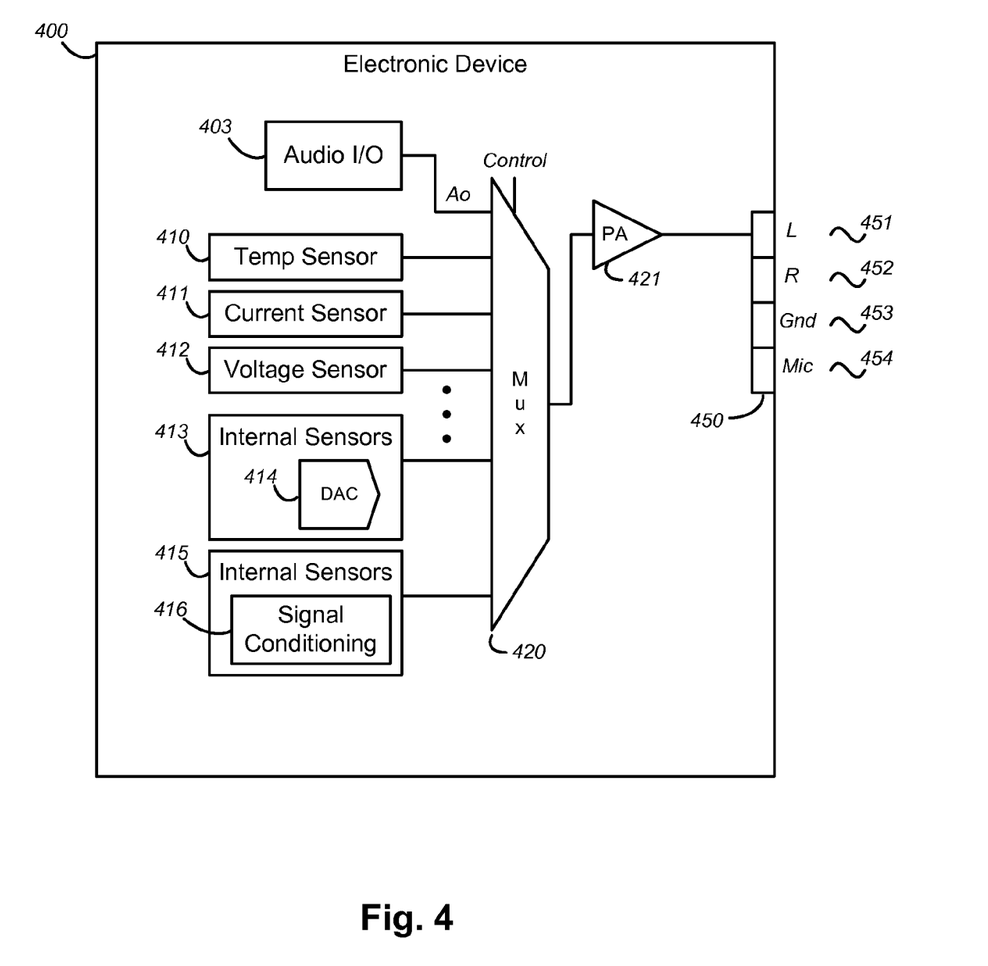
FIG. 4 illustrates example sensors that may be coupled to an audio connector port according to some embodiments.

Various embodiments of the techniques described herein may be used to access a variety of information in an electronic device. FIG. 4 illustrates example sensors that may be coupled to an audio connector port according to some embodiments. In this example, electronic device 400 includes an audio circuit 403 generating an audio signal Ao to an input of MUX 420. An output of MUX 420 is coupled to an input of audio power amplifier 421. An output of audio power amplifier 421 is coupled to a left stereo output 451 of an audio connector port 450. During a first (normal) operating mode, audio signals may be amplified and provided to output terminal 451 and used to drive speakers in a headphone (not shown), for example. In this example, multiple sensors are coupled to different inputs of MUX 420, and may be selectively coupled through audio power amplifier 421 to output terminal 451. Example sense circuits may include temperature sensors 410, current sensors 411, voltage sensors 412, internal sensors 413 having digital to analog converters (DACs) 414 coupled to the outputs to convert digital signals to analog signals, and internal sensors 415 having signal conditioning circuits 416 to condition sensed circuit parameters to produce output signals optimized for the input of audio amplifier 421, for example. While the present example illustrates a single MUX and audio amplifier output, it is to be understood that any combination of the previously described configurations could be used with the example sense circuits shown in FIG. 4.

Figure 5:
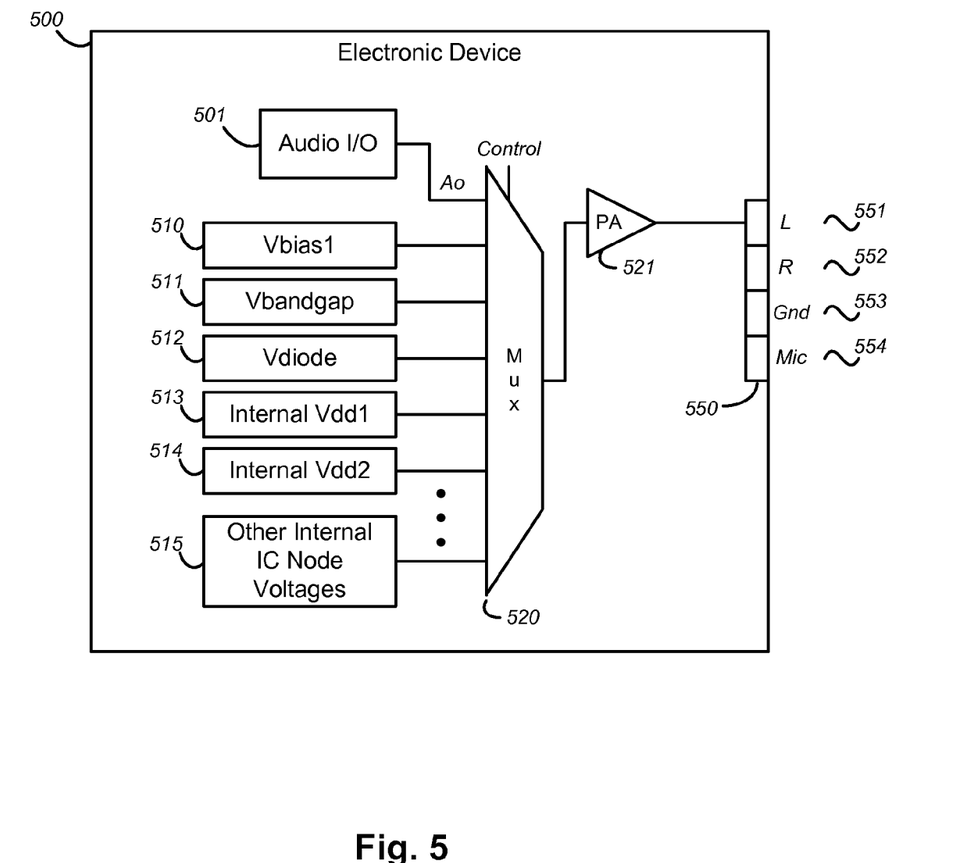
FIG. 5 illustrates example voltages that may be sensed according to some embodiments.

FIG. 5 illustrates example voltages that may be sensed according to some embodiments. In this example, electronic device 500 includes a similar audio circuit 501, MUX 520, and audio power amplifier 521 to generate audio signals on output terminal 551. This example shows multiple different voltages that may be sensed and coupled through MUX 520 and audio power amplifier 522 to generate a sensed signal at audio output terminal 551. For example, voltages that may be sensed include bias voltages 510, bandgap voltages 511, diode voltages 512, internal power supply voltages Vdd1 513 and Vdd2 514 and other internal integrated circuit node voltages 515.

Figure 6:
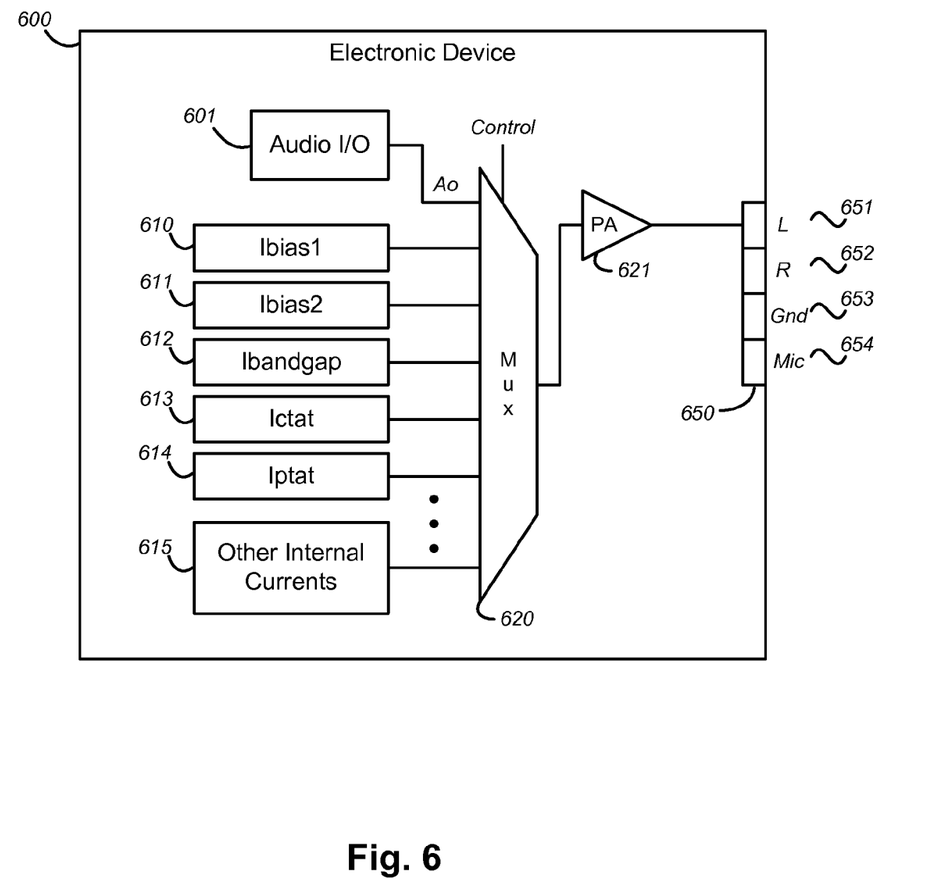
FIG. 6 illustrates example currents that may be sensed according to some embodiments.

FIG. 6 illustrates example currents that may be sensed according to some embodiments. In this example, electronic device 600 includes a similar audio circuit 601, MUX 620, and audio power amplifier 621 to generate audio signals on output terminal 651. This example shows multiple different currents that may be sensed and coupled through MUX 620 and audio power amplifier 622 to generate a sensed signal at audio output terminal 651. For example, currents that may be sensed include bias currents Ibias1 610 and Ibias2 611, bandgap currents 612, current complementary to absolute temperature (CTAT) 613, current proportional to absolute temperature (PTAT) 614, or other currents in various different parts of the electronic device, for example. In some embodiments, sensed currents may be converted to an analog voltage by sense circuitry, for example, and coupled through MUX 620 to audio power amplifier 621.

Figure 7:
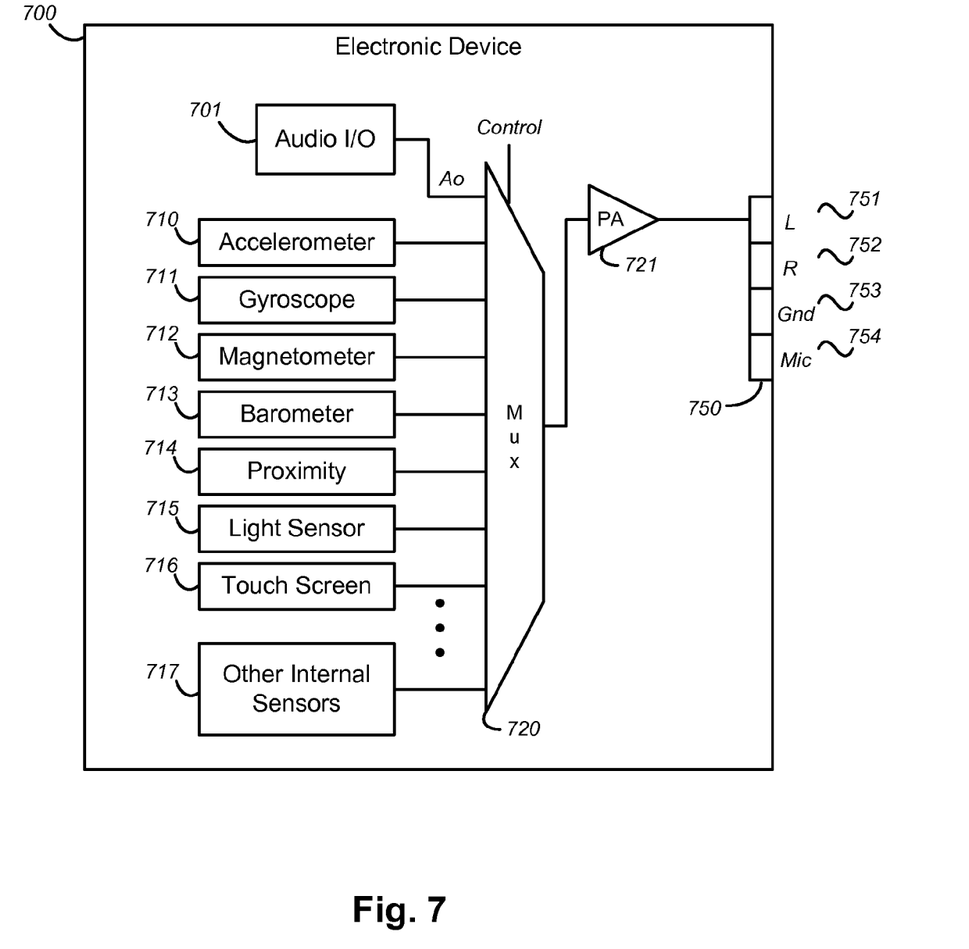
FIG. 7 illustrates example systems that may be sensed according to some embodiments.

FIG. 7 illustrates example systems that may be sensed according to some embodiments. In this example, electronic device 700 includes a similar audio circuit 701, MUX 720, and audio power amplifier 721 to generate audio signals on output terminal 751. This example shows multiple different subsystems that may be sensed and coupled through MUX 720 and audio power amplifier 722 to generate a sensed signal at audio output terminal 751. For example, subsystems that may sense internal parameters for external evaluation include an accelerometer 710, gyroscope 711, magnetometer 712, barometer 713, proximity detector 714, light sensor 715, touch screen 716, and a variety of other internal subsystem sensors, for example. Example sensors may be integrated into silicon or a substrate of a system-on-chip device or they can be placed on any printed circuit boards of the electronic device or they can be inside a phone, tablet, or other external devices as a separate individual module.

Figure 8:
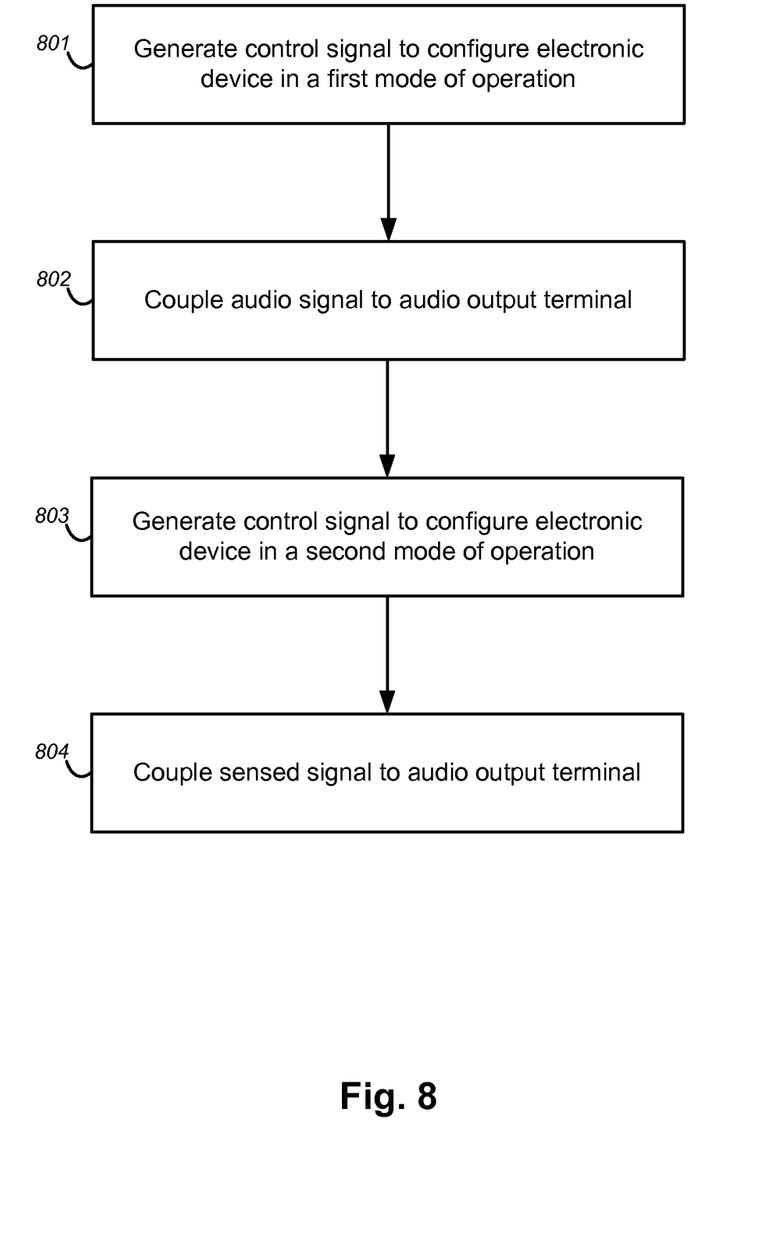
FIG. 8 illustrates an audio interface process according to an embodiment.

FIG. 8 illustrates an audio interface process according to an embodiment. In one embodiment, internal electrical parameters of an electronic device may be accessed and provided to another system using an audio connection port and audio cable. At 801, a control signal is generated to configure the device in a first (e.g., normal) mode of operation. In the first mode, an audio signal may be generated and coupled to an audio output terminal through a MUX and an audio power amplifier, for example, at 802. At 803 another control signal is generated to configure the electronic device in a second (e.g., evaluation, storage, transfer, communication, or test) mode of operation. The control signals may reconfigure the MUX to couple different input terminals to one or more output terminals, for example. In the second mode, sensed signals (e.g., an analog voltage) may be coupled from an output of one or more sense circuits to an input of the MUX, which in turn is coupled to an output of the MUX and to the input of an audio amplifier and to an audio output terminal of an audio connector port for data analysis by a remote system, for example.

Figure 9A:
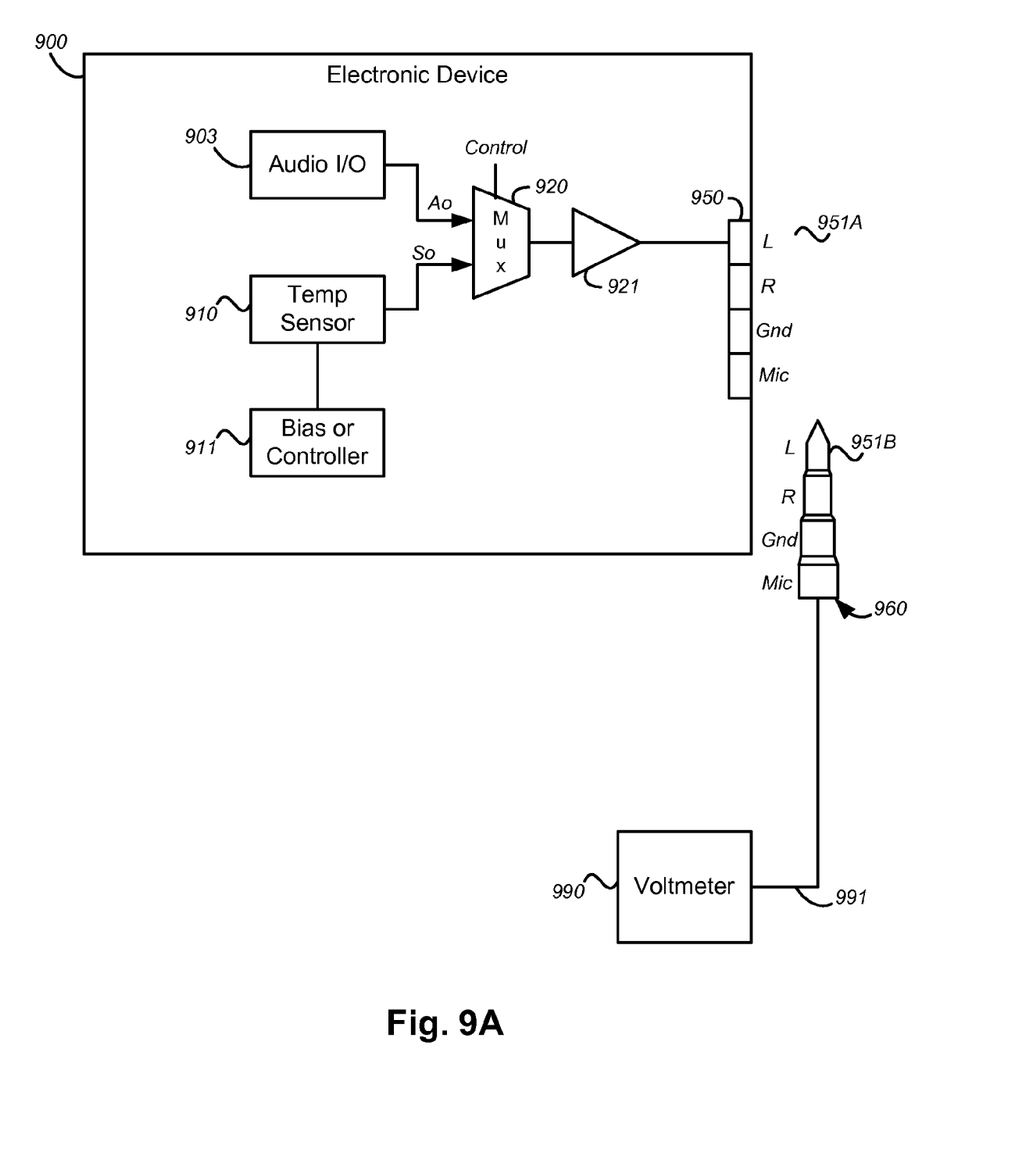
FIGS. 9A-B illustrates an example of an audio interface used to temperature sensing according to an embodiment.
Figure 9B:
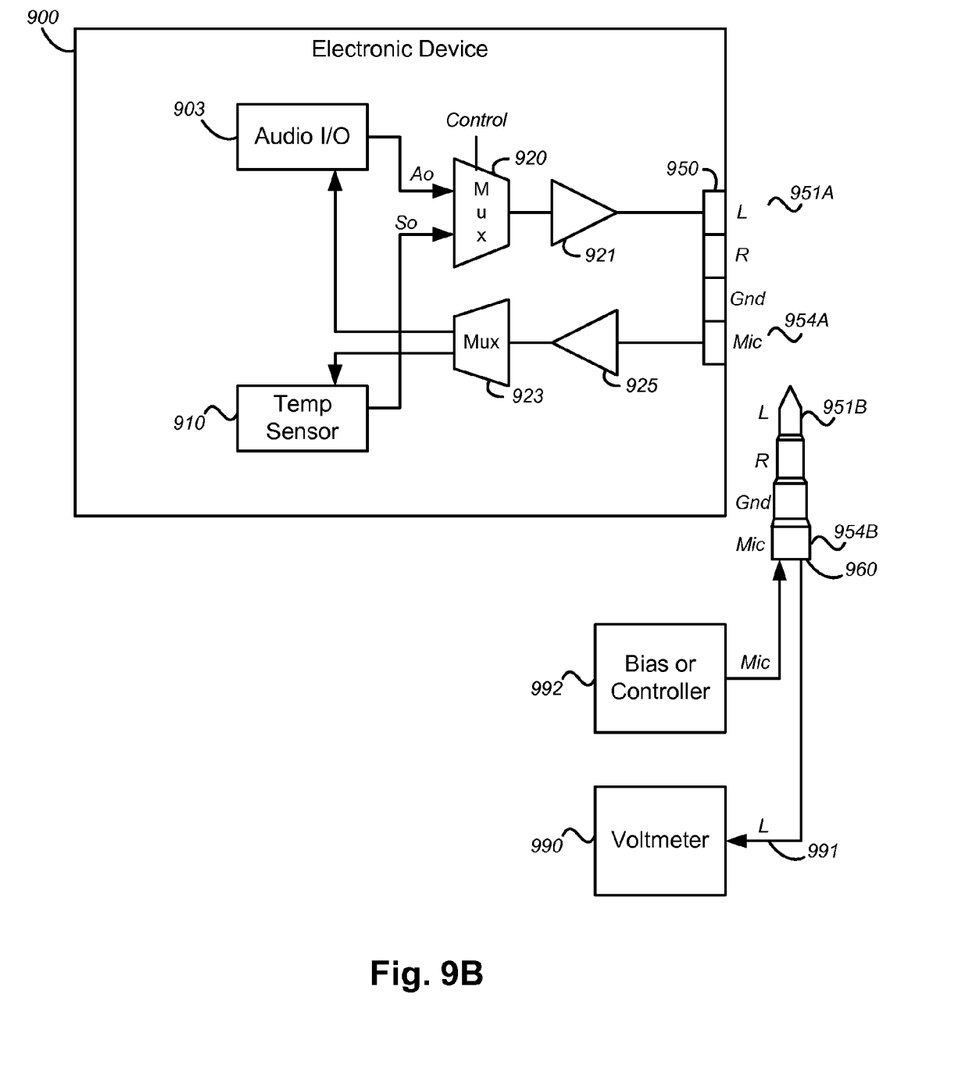

FIGS. 9A-B illustrates an example of an audio interface used to temperature sensing according to an embodiment. In this example, the system is configured as shown in FIG. 9A, where temperature sensor ("temp sensor") 910 generates a voltage corresponding to temperature (e.g., 25 degrees Celsius) as an analog output signal So. The temp sensor voltage, So, is coupled through MUX 920 and audio power amplifier 921, and the amplified signal is coupled to an external voltmeter 990 via left stereo output terminal 951A connected to left stereo plug connector 951B, for example. In this case, temp sensor 910 is biased by an internal bias generator or controller 911. In a second step, the system may be configured as shown in FIG. 9B so that temp sensor 910 is biased by an external bias generator or controller 992. Bias generator or controller 992 may provide an input signal on the Mic input via Mic connector 954B connected to Mic input terminal 954A, which couples the input signal through audio amplifier 925 and MUX 923 to temp sensor 910, for example. The output of temp sensor 910 may be measure by external voltmeter 990 as shown in FIG. 9B and described in FIG. 9A. In addition, the external bias generator 992 may be swept and an optimal point of output of the temp sensor can be identified. Further, the temp sensor curve for temperature versus bias voltage may be obtained. These results will enable calibration and accurate results.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. An electronic device comprising:
    an audio connector port, the audio connector port comprising a ground terminal and one or more audio output terminals;
    a first audio amplifier comprising an input terminal and an output terminal, wherein the output terminal of the first audio amplifier is coupled to a first audio output terminal of the one or more audio output terminals;
    a multiplexer having a plurality of input terminals and an output terminal coupled to the input terminal of the first audio amplifier;
    an audio circuit to generate an audio signal to a first input terminal of the plurality of input terminals of the multiplexer; and
    a sense circuit to generate an analog voltage to a second input terminal of the plurality of input terminals of the multiplexer,
    wherein, in a first mode of operation, the multiplexer couples the audio signal on the first input terminal of the multiplexer through the first audio amplifier to the first audio output terminal, and in a second mode of operation, the multiplexer couples the analog voltage on the second input terminal of the multiplexer through the first audio amplifier to the first audio output terminal.

2. The electronic device of claim 1 further comprising a second sense circuit, wherein the second sense circuit generates a second analog voltage to a third input terminal of the multiplexer, and wherein in the second mode of operation, the multiplexer couples the second analog voltage on the third input terminal of the multiplexer through the first audio amplifier to the first audio output terminal.

3. The electronic device of claim 1 wherein the audio connector port comprises two audio output terminals, the electronic device further comprising a second audio amplifier comprising an input terminal and an output terminal, wherein the output terminal of the second audio amplifier is coupled to a second audio output terminal, and wherein the sense circuit generates a differential analog voltage to the second input terminal of the multiplexer and a third input terminal of the multiplexer, and wherein in the second mode of operation, the multiplexer couples a second analog voltage on the third input terminal of the multiplexer through the second audio amplifier to the second audio output terminal.

4. The electronic device of claim 1 wherein the audio connector port comprises two audio output terminals, the electronic device further comprising a second audio amplifier comprising an input terminal and an output terminal, wherein the output terminal of the second audio amplifier is coupled to a second audio output terminal, and wherein the sense circuit generates a second analog voltage to a third input terminal of the multiplexer, and wherein in the second mode of operation, the multiplexer couples the second analog voltage on the third input terminal of the multiplexer through the second audio amplifier to the second audio output terminal.

5. The electronic device of claim 1 wherein the sense circuit is a voltage sense circuit.

6. The electronic device of claim 1 wherein the sense circuit is a current sense circuit.

7. The electronic device of claim 1 wherein the sense circuit is a temperature sensor and wherein the analog voltage corresponds to a temperature.

8. The electronic device of claim 1 wherein the sense circuit comprises a digital-to-analog converter having an output coupled to the second input terminal of the multiplexer.

9. The electronic device of claim 1 wherein the sense circuit comprises a signal conditioning circuit to sense a voltage or a current and produce the analog voltage having a maximum value within the maximum input range of the audio amplifier.

10. The electronic device of claim 1 wherein the analog voltage has a frequency of less than 20 kHz.

11. The electronic device of claim 1 wherein the analog voltage has a value less than a maximum value of the audio signal.

12. The electronic device of claim 1 wherein the first audio amplifier is an audio power amplifier having a noise characteristic below a first audio noise threshold and a harmonic distortion characteristic below a first audio harmonic distortion threshold.

13. The electronic device of claim 1 wherein the sense circuit is internal on an integrated circuit and senses parameters of other electronics on the integrated circuit.

14. The electronic device of claim 1 wherein the sense circuit is external to an integrated circuit and inside the electronic device.

15. A method of sensing internal parameters of an electronic device comprising:
    generating in the electronic device, a first control signal to configure the electronic device in a first mode of operation, wherein the electronic device comprises an audio connector port, the audio connector port comprising a ground terminal and one or more audio output terminals, a first audio amplifier comprising an input terminal and an output terminal, wherein the output terminal of the first audio amplifier is coupled to a first audio output terminal of the one or more audio output terminals, a multiplexer having a plurality of input terminals and an output terminal coupled to the input terminal of the first audio amplifier, an audio circuit to generate an audio signal to a first input terminal of the multiplexer, and a sense circuit to generate an analog voltage to a second input terminal of the multiplexer;

coupling, in the first mode of operation, the audio signal on the first input terminal of the multiplexer through the first audio amplifier to the first audio output terminal;

generating in the electronic device, a second control signal to configure the electronic device in a second mode of operation; and coupling, in the second mode of operation, the analog voltage on the second input terminal of the multiplexer through the first audio amplifier to the first audio output terminal.

16. The method of claim 15 wherein the electronic device further comprises a second sense circuit, wherein the second sense circuit generates a second analog voltage to a third input terminal of the multiplexer, the method further comprising coupling, in the second mode of operation, the second analog voltage on the third input terminal of the multiplexer through the first audio amplifier to the first audio output terminal.

17. The method of claim 15 wherein the audio connector port comprises two audio output terminals, the electronic device further comprising a second audio power amplifier comprising an input terminal and an output terminal, wherein the output terminal of the second audio amplifier is coupled to a second audio output terminal, and wherein the sense circuit generates a differential analog voltage to the second input terminal of the multiplexer and a third input terminal of the multiplexer, the method further comprising:

coupling, in the second mode of operation, the second analog voltage on the third input terminal of the multiplexer to the second audio output terminal.

18. The method of claim 15 wherein the electronic device further comprises a second sense circuit, wherein the audio connector port comprises two audio output terminals, the electronic device further comprising a second audio amplifier comprising an input terminal and an output terminal, wherein the output terminal of the second audio amplifier is coupled to a second audio output terminal, and wherein the second sense circuit generates a second analog voltage to a third input terminal of the multiplexer, the method further comprising:

coupling, in the second mode of operation, the second analog voltage on the third input terminal of the multiplexer through the second audio amplifier to the second audio output terminal.

19. The method of claim 15 wherein the sense circuit comprises a digital-to-analog converter having an output coupled to the second input terminal of the multiplexer.

20. The method of claim 15 wherein the sense circuit comprises a signal conditioning circuit to sense a voltage or a current and produce the analog voltage having a maximum value within the maximum input range of the audio amplifier.

21. An electronic device comprising:

an audio connector port, the audio connector port comprising a ground terminal and one or more audio output terminals;

a first audio amplifier comprising an input terminal and an output terminal, wherein the output terminal of the first audio amplifier is coupled to a first audio output terminal of the one or more audio output terminals;

an audio circuit to generate an audio signal;

sensing means to generate an analog voltage; and output selection means to alternatively couple the audio signal and the analog voltage to the input terminal of the first audio amplifier, wherein, in a first mode of operation, the audio signal is coupled through the first audio amplifier to the first audio output terminal, and in a second mode of operation, the analog voltage is coupled through the first audio amplifier to the first audio output terminal.

22. The electronic device of claim 21 wherein the output selection means comprises one or more multiplexers.

* * * * *